(12) United States Patent
Suzuki

(10) Patent No.: US 6,232,051 B1
(45) Date of Patent: May 15, 2001

(54) METHOD FOR PRODUCTION OF SEMICONDUCTOR DEVICES

(76) Inventor: Kazuaki Suzuki, Kanagawa (JP)

(*) Notice: Subject to any disclaimer, the term of this patent is extended or adjusted under 35 U.S.C. 154(b) by 0 days.

(21) Appl. No.: 09/124,217

(22) Filed: Jul. 29, 1998

(30) Foreign Application Priority Data

Oct. 20, 1997 (JP) .................................................. 9-287483

(51) Int. Cl.$^7$ ...................................................... G03F 7/20
(52) U.S. Cl. .......................... 430/394; 430/396; 430/311
(58) Field of Search ...................... 430/311, 394, 430/396

(56) References Cited

U.S. PATENT DOCUMENTS 5,885,756 * 3/1999 Yun ...................................... 430/394

FOREIGN PATENT DOCUMENTS

| 63-38231 | 2/1988 | (JP) . |
| 3-84921 | 4/1991 | (JP) . |
| 7-142309 | 6/1995 | (JP) . |

* cited by examiner

*Primary Examiner*—Mark F. Huff
*Assistant Examiner*—Nicole Barreca

(57) ABSTRACT

The resist to be used for the method of this invention in producing a semiconductor device is patterned by a procedure which comprises the steps of disposing in the direction of a semiconductor wafer a first mask having circuit patterns repeatedly formed at a plurality of positions, then shielding those of said plurality of circuit patterns which overlap the edge of the semiconductor wafer with a blind to an extent such that the remaining circuit patterns are not shielded, exposing a resist overlying the semiconductor wafer by using the first mask held in a state partially shielded by the blind, projecting light through a second mask provided with a light passing pattern defined by a shielding film to an area of the resist to which the edge of the blind is transferred, and developing the resist

13 Claims, 9 Drawing Sheets

METHOD FOR PRODUCTION OF SEMICONDUCTOR DEVICES

BACKGROUND OF THE INVENTION

1. Field of the Invention

This invention relates to a method for the production of semiconductor devices.

2. Description of the Prior Art

The process of producing a semiconductor integrated circuit includes the operation of forming a film on a semiconductor wafer and patterning the film by photolithography at several steps.

For the purpose of forming a plurality of identical semiconductor integrated circuits on one semiconductor wafer, the photolithography adopts the method of step and repeat reduction-type projection printing. The projection printing method utilizes a reticule having a plurality of identical circuit patterns arrayed adjacently thereon, to effect simultaneous exposure of a resist to the plurality of circuit patterns.

The semiconductor wafer, after having these semiconductor integrated circuits formed thereon, is divided into individual chips, each bearing one of the semiconductor integrated circuits.

However, as illustrated in FIG. 1A, since a semiconductor wafer 101 has a circular shape and, one unit circuit pattern forming area on a reticule 102 has a rectangular shape, a certain proportion of the circuit patterns 103a to 103d on the reticule 102 used during the exposure inevitably protrude from the semiconductor wafer 101 during the exposure (the hatched area in the diagram). The circuit patterns 103d which are formed near the circumference of the semiconductor wafer 101 and contain a missing portion will be referred to hereinafter as "rejectable circuit patterns" or "rejectable chips."

Also, as the puddle developing method, in which a liquid developer is piled on a semiconductor wafer, is generally adopted as the means to develop an exposed resist, the circumferential region of the semiconductor wafer is insufficiently developed. This inevitably gives rise to abnormally shaped resist patterns.

When the abnormally shaped resist patterns such as this exist near the circumference edge of the semiconductor wafer, films which are patterned using this resist pattern as a mask, are also abnormally shaped. Problems can occur, for example during the formation of storage electrodes on DRAM, when a hydrofluoric acid treatment is done to remove the silicon oxide film from beneath a polycrystalline silicon film, which forms the storage electrode. The polycrystalline silicon that is not connected to the substrate in the abnormally patterned area floats off and becomes attached as a particle in the normal pattern area, forming a factor causing reduced yields.

As a way of removing such abnormal patterns, a method of projecting light onto the whole area destined to produce rejectable chips after the exposure may be adopted as disclosed in JP-A-07142309A. This method, however, is not as effective in preventing the occurrence of abnormal patterns as expected because it produces no change in the fact that the development is insufficient in the area of rejectable chips.

To cope with this problem, a method has been adopted of omitting the projection of the circuit patterns 103a to 103d of the reticule 105 of FIG. 1B at the positions where the circuit patterns overlap the circumference edge of the semiconductor wafer 101, i.e. the position which correspond to the hatched area of FIG. 1A.

However if the exposure to light is omitted from the area in which the circumference edge of the semiconductor wafer overlaps at least one of the circuit patterns on the reticule, a wasted area of a width which covers one to three circuit patterns arises near the circumference edge of the semiconductor wafer. This causes a problem of lowered yield.

The practice of forming only one circuit pattern on a reticule and using this reticule for the purpose of exposure to light is also an option. However, this causes a large increase in the number of shots of light involved during the treatment of exposure to light, and inevitably results in a decrease in the throughput.

SUMMARY OF THE INVENTION

The object of this invention is to provide a method for the production of semiconductor devices, which incorporates therein a patterning step which is capable of repressing the occurrence of particles and also improves the throughput and the yield during the treatment of exposure to light.

In this invention, after a plurality of circuit patterns in a reticule (exposure mask) are projected onto a resist on a semiconductor wafer, with the exposure of the circuit patterns which overlap with the edge of the wafer being blocked by a blind, a separate mask is used to selectively expose the parts in the resist to which the edge of the blind was projected, and to remove these parts.

As a result, the exposure of the ineffective circuit patterns which overlap with the edge of the wafer is prevented, the formation of abnormal resist patterns which occurs around the circumference of a semiconductor wafer is avoided, and the occurrence of abnormal resist patterns which occur as a result of the blurred focus where the edge of the blinds are projected is also prevented. It is therefore possible to greatly suppress the occurrence of particles, which arise from these abnormal resist patterns.

Further, since only those of the plurality of circuit patterns formed in the reticule which do not overlap the edge of the semiconductor wafer are exposed to light, the number of available circuit patterns that are formed on the semiconductor wafer does not need to be reduced. As a result, the yield is improved because the number of available chips per semiconductor wafer is increased.

There is no reduction of throughput because the reticule to be used has a plurality of circuit patterns formed therein.

The reticule which is used for erasing the edge of a blind transferred to the resist may be formed in the same reticule that contains the circuit patterns, or may be formed as a separate entity.

When a plurality of circuit patterns are to be arranged repeatedly in a lengthwise and a crosswise direction in one reticule, this reticule is provided with lengthwise oblong or crosswise oblong light passing patterns for erasing the latent image of the edge of the blind in the resist. In this case, the aperture area of the lens can be effectively utilized by locating the light passing pattern in the area surrounding the circuit patterns area and near the center of the circuit patterns area.

Further, the lengthwise oblong light passing pattern is given a greater length than one side of a circuit pattern in the lengthwise direction, and the crosswise oblong light passing pattern given a greater length than another side of the circuit pattern in the crosswise direction. In this arrangement, it is possible to leave no space between the projections of lights on line of the latent image of the edge of the blind, when the part of the resist which was exposed at the edge of the blind is split into several parts for the exposure.

The available exposure area of the lens can be utilized to the utmost by positioning the light passing pattern close to the center of the circuit patterns area. The formulation of the program at the stage of designing the circuit patterns on the reticle is facilitated if the light passing pattern is symmetrical.

It becomes possible to obviate the necessity of changing reticules and avoid a decline in throughput arising from re-alignment, if the circuit patterns and the light passing patterns for the erasure of the latent image of the blind edge are formed on one and the same reticle.

DESCRIPTION OF THE PREFERRED EMBODIMENTS

Now, the preferred embodiments of this invention will be described below with reference to the accompanying drawings.

Figure 1A:
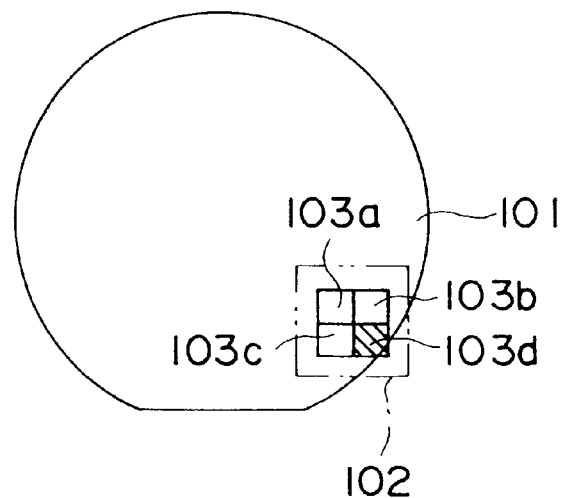
FIG. 1A depicts the results of the exposure to light by the conventional method of light exposure and FIG. 1B is a plan view schematically illustrating a reticle in popular use.
Figure 1B:
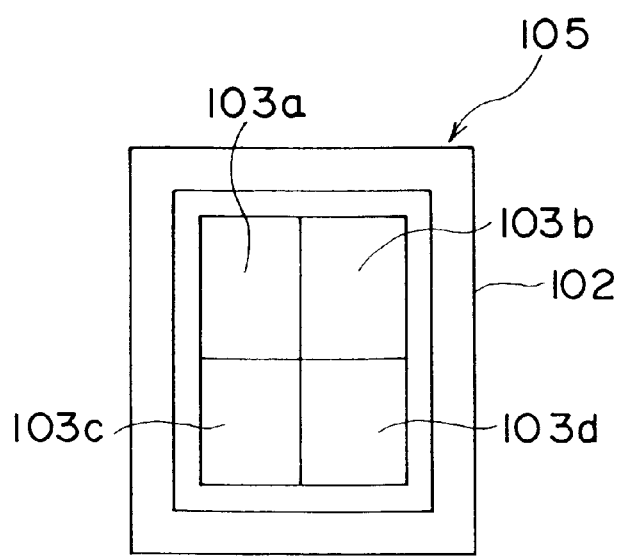
Figure 2:
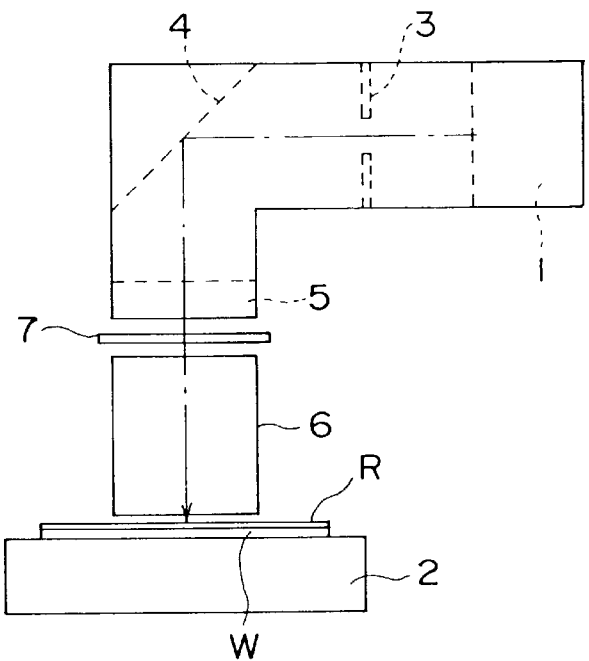
FIG. 2 is a structural diagram of a device for light exposure to be used in an embodiment of this invention.

FIG. 2 illustrates one example of the exposure device to be used for the exposure of a resist in the production of a semiconductor device according to an embodiment of this invention.

In this exposure device, a blind 3, a mirror 4, an upper lens system 5, and a projection reduction part 6 are positioned sequentially in the order mentioned, from a light source 1 toward a wafer stage 2. A reticule (exposure mask) 7, which will be specifically described herein below, is interposed between the upper lens system 5 and the projection reduction part 6. The circuit patterns formed in the circuit pattern areas of the reticle are projected onto the resist R on the semiconductor wafer W.

Figure 3:
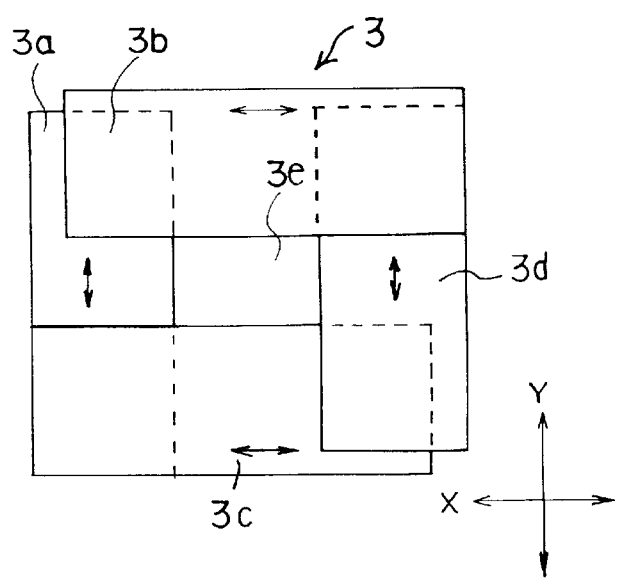
FIG. 3 is a plan view illustrating one example of a blind in the device for light exposure shown in FIG. 2.

The blind 3 is provided with a plurality of shielding plates 3a to 3d for example as illustrated in FIG. 3, and it is possible to form an opening part 3e of a necessary shape, by appropriately combining these shielding plates 3a to 3d. The size and the position of the opening part 3e can be varied by moving these shielding plates 3a to 3d individually in the lengthwise and the crosswise direction.

Figure 4:
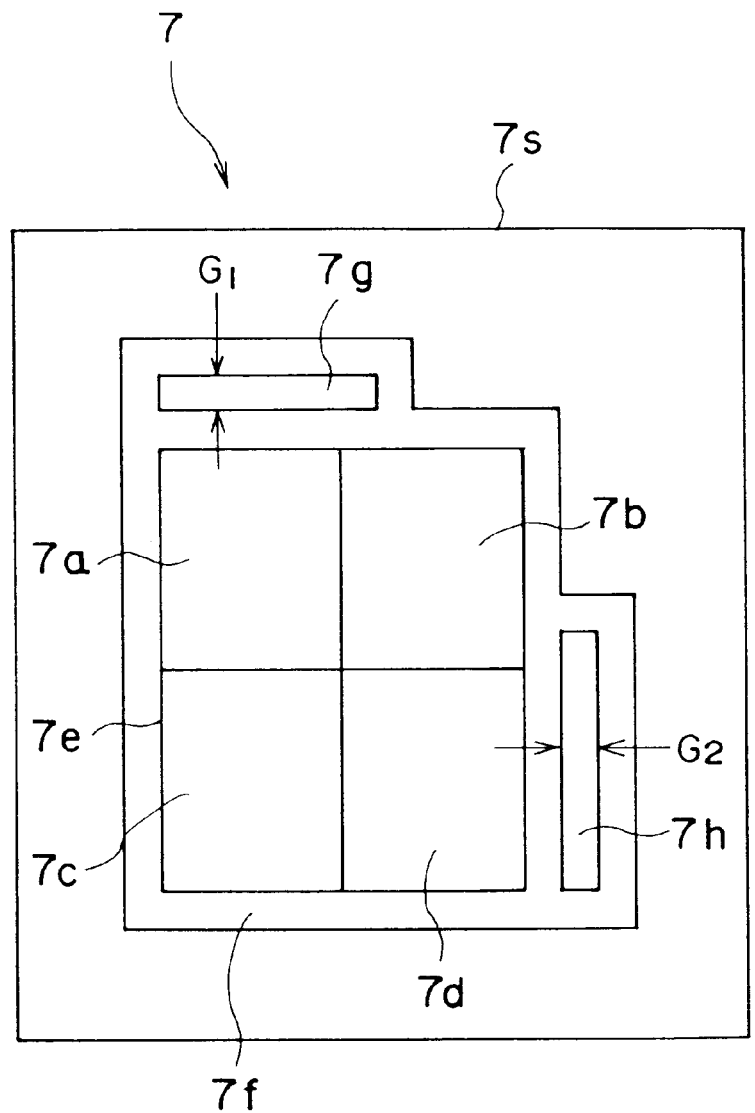
FIG. 4 is a plan view illustrating the first example of a reticule to be used in an embodiment of this invention.
Figure 4:
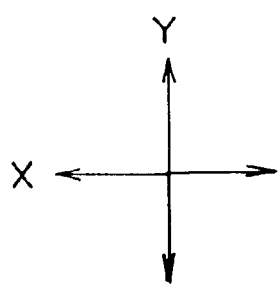

The reticule 7 is provided with a light-passing substrate (a quartz substrate, for example) 7s, which is having a polygonal shape, for example, as illustrated in FIG. 4. On this light-passing substrate 7s, a first through a fourth rectangular circuit pattern area 7a to 7d are positioned adjacently. A rectangular assembly area 7e formed by the assemblage of these circuit pattern areas 7a to 7d is enclosed by a shielding frame 7f, made of chromium. Outside each of two pairs of adjoining sides in the four sides of the assembly area 7e, a first slit pattern (light passing pattern) 7g and a second slit pattern (light passing pattern) 7h are formed parallel to the sides mentioned above, and within the shielding frame 7f. The first slit pattern 7g is about 0.2 mm to 1.0 mm (specifically 0.5 mm, for example) longer than the side of the circuit pattern 7a lying parallel thereto and the second slit pattern 7h is about 0.2 mm to 1.0 mm (specifically 0.5 mm, for example) longer than the side of the circuit pattern 7d lying parallel thereto. The numerical value in this range of 0.2 mm to 1.0 mm may be equal to the width of the scribe line, for example. The scribe line is a line which is severed when the plurality of circuit patterns 7a to 7d are split into chips.

Although not specifically illustrated in the diagram, the patterns for, wiring, capacitor cell plates, or gate electrodes for the MOS transistor, for example, are formed inside the circuit pattern areas 7a to 7d of the reticule 7 using a chromium film, i.e. the same material as the shielding frame 7f.

The size of the area of the reticule 7 is 150 mm×150 mm, for example, the size of the area of the circuit pattern areas 7a to 7d is about 120 mm×120 mm at most, and the gaps $G_1$ and $G_2$ of the first and the second slit pattern 7a and 7h are 2 mm each. The circuit patterns formed in the circuit pattern areas 7a to 7d are projected onto the resist R on the semiconductor wafer W, and reduced to ⅕ of their original size. The reticule 7 constructed as described above is interposed between the upper lens system 5 and the reduction projection part 6 of the exposure device and the circuit pattern areas 7a to 7d of the reticule 7 are repeatedly projected onto the resist R on the semiconductor wafer W as illustrated in FIG. 5A.

Figure 5A:
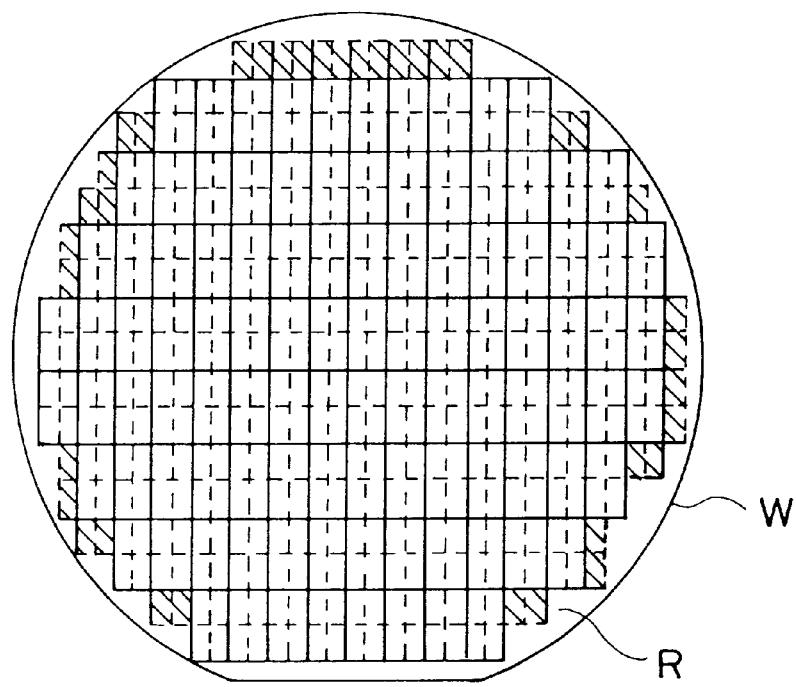
FIG. 5A is a plan view illustrating the area on a semiconductor wafer which is exposed to light by the reticle shown in FIG. 4.

The rectangular parts enclosed within the solid lines illustrated in FIG. 5A do not overlap the circumference of the semiconductor wafer W. These are the areas onto which all the circuit pattern areas 7a to 7d shown in FIG. 4 are simultaneously projected.

Figure 6A:
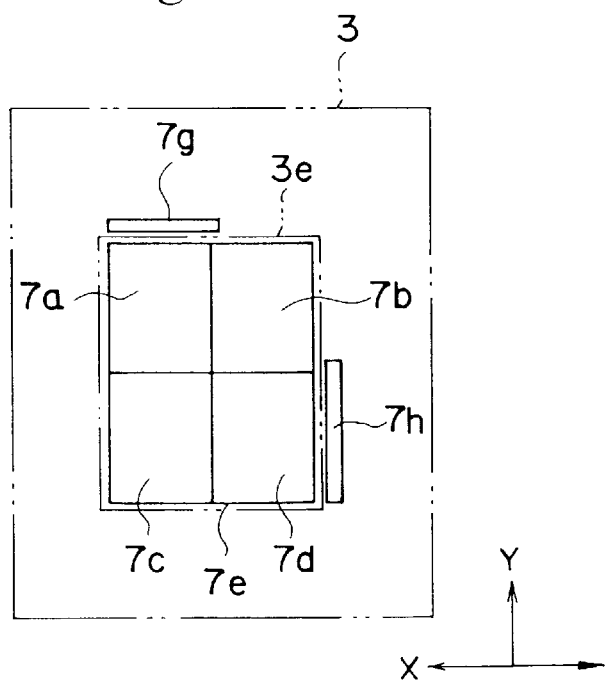
FIG. 6A is a plan view illustrating the first example of the positional relationship between the reticle as shown in FIG. 4, and the blind shown in FIG. 3.
Figure 6B:
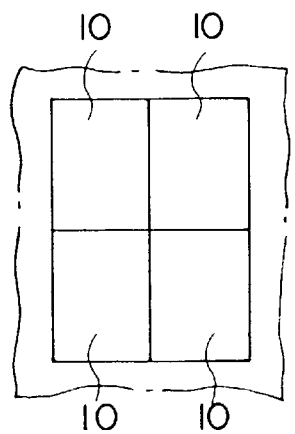
FIG. 6B is a plan view schematically illustrating the latent pattern image resulting from the exposure using a reticle shielded from light by a blind as shown in FIG. 6A.

For the sake of the exposure to these areas, as shown in FIG. 6A, the shape and the position of the opening part 3e of the blind 3 are set such that the light passing the blind 3 is allowed to pass exclusively through all the circuit pattern areas 7a to 7d of the reticule 7. As a result, the latent image of the pattern described on the resist R by one projection of light forms a plan view as is illustrated in FIG. 6B, with the result that the latent images of the plurality of circuit patterns 10 will be formed simultaneously in an adjoining manner. The plurality of circuit patterns 10 shown in FIG. 6B are repeatedly projected onto the resist R by the motion of the wafer stage 2 in either or both of the X and Y directions.

In contrast, the circuit patterns in the area to which not all of the circuit patterns on the reticule 7 is transferred, namely the hatched area shown in FIG. 5A, are projected as follows.

Figure 7A:
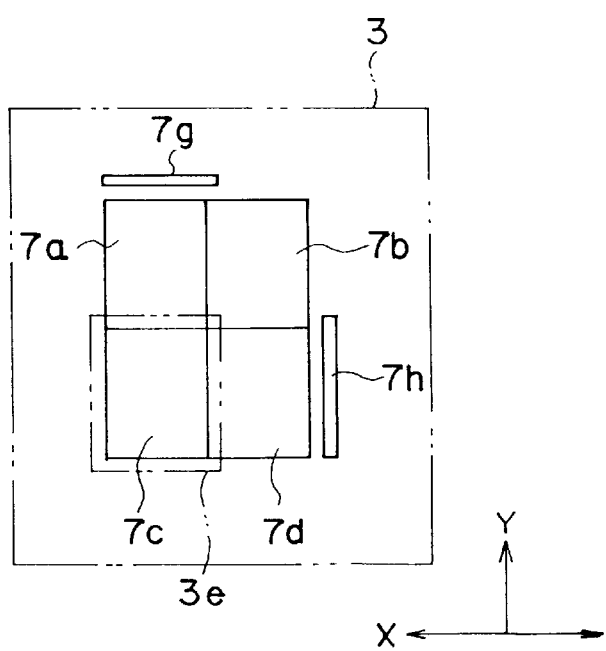
FIG. 7A is a plan view illustrating the second example of the positional relationship between the reticle and the blind shown in FIG. 4.

First, when the circuit pattern areas 7a, 7b, and 7d, i.e. some of the circuit pattern areas on the reticule 7, would overlap with the circumference of the semiconductor wafer W during the course of exposure, the opening part 3e of the blind 3 is reshaped by adjusting the positions of the shielding plates 3a to 3d of the blind 3 as illustrated in FIG. 7A. The position, size, and shape of the opening formed are such that the light is only projected onto the circuit pattern area 7c, which does not overlap the edge of the semiconductor wafer W, and peripheral area thereof. In this case, the opening part 3e essentially blocks the passing of light through the other circuit pattern areas 7a, 7b, and 7d.

Therefore, only available circuit patterns, with no missing part, are exposed on the resist R.

Figure 7B:
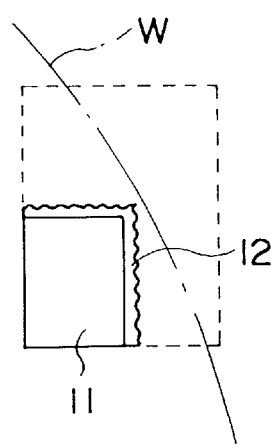
FIG. 7B is a plan view schematically illustrating the latent pattern image resulting from exposure using a reticle shielded from light by a blind as shown in FIG. 7A.

Consequently, the latent images of circuit patterns 11 which are formed on the resist R assume a profile as shown in FIG. 7B. Along the sides of the circuit pattern area 7c which are not defined by the shielding frame 7f, the edges of the circuit pattern areas 7a, 7b, and 7d are projected in part, as severed by the blind 3. The circuit patterns which are consequently exposed only partially to light are referred to as rejectable circuit patterns 12.

On the resist R which has been exposed to the part severed by the blind 3, a blur of the focal point occurs in the part to which the edge of the blind 3 is projected. In other words, when the circuit patterns 7a, 7b, and 7d, i.e. the ineffective circuit patterns on the reticule 7, are shielded by the blind 3, the relevant edge part of the blind 3 is projected onto the resist R. Since the edge part of the blind 3 is not focussed on the resist R, it produces a blur of the focal point and forms a cause for the occurrence of abnormal patterns and consequently for the occurrence of the particles which were described in the paragraphs introducing the prior art. Therefore, the part of the resist with the blurred focal point is removed by projecting light through the first and the second slit patterns, 7g and 7h, onto the area in which the edge part of the blind 3 appears. The edge of the blind 3 under discussion will occasionally be referred to hereinafter as "blind edge." The following additional exposure or double exposure is carried out to remove the rejectable circuit pattern 12 from the area surrounding the normally exposed circuit pattern 11.

Figure 8A:
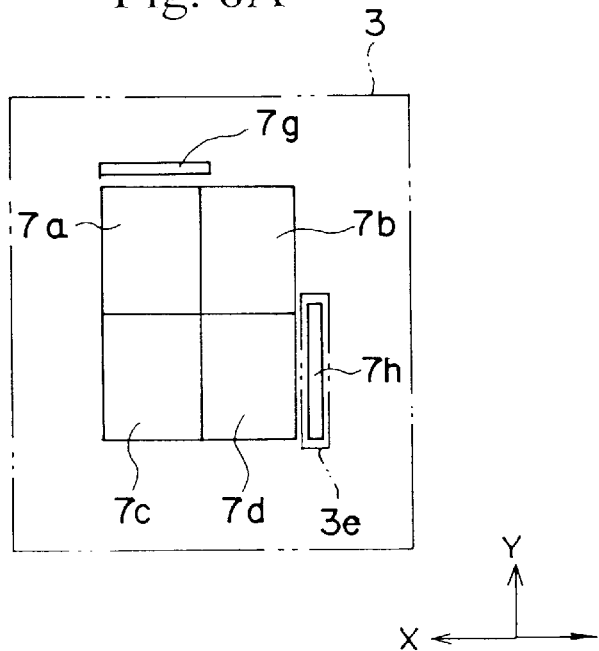
FIG. 8A is a plan view illustrating the third example of the positional relationship between the reticle and the blind shown in FIG. 4.

By moving each the shielding plates 3a to 3d of the blind 3, the opening part 3e of the blind 3 is formed in a position, size, and shape such that the light is projected only through the second slit pattern 7h on the reticule 7, as shown in FIG. 8A. The positional correspondence between the opening part 3e and the rejectable circuit pattern 12 is attained by moving the wafer stage 2.

Then, in the exposure device, the light which has passed through the second slit pattern 7h is projected onto the part of rejectable circuit pattern 12 which adjoins the available circuit pattern 11 in the X direction. Consequently, the latent pattern image as shown in FIG. 7B is formed by completely erasing the X direction part of the rejectable circuit pattern 12 shown in FIG. 8B, to which the blind edge is transferred.

Figure 8B:
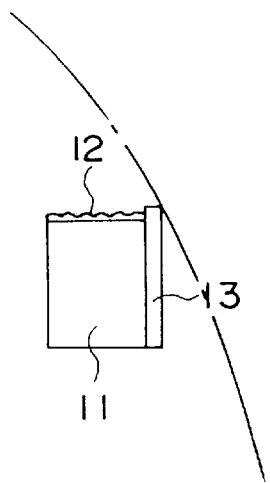
FIG. 8B is a plan view schematically illustrating the latent pattern image resulting from exposure using a reticle shielded from light by a blind as shown in FIG. 8A.

As a result, the edge of the available circuit pattern 11 on the X direction side is sharpened as illustrated in FIG. 8B and, at the same time, the edge of the blind existing on the X direction side is erased and a latent image 13 of a fine light exposure pattern is formed.

Figure 9A:
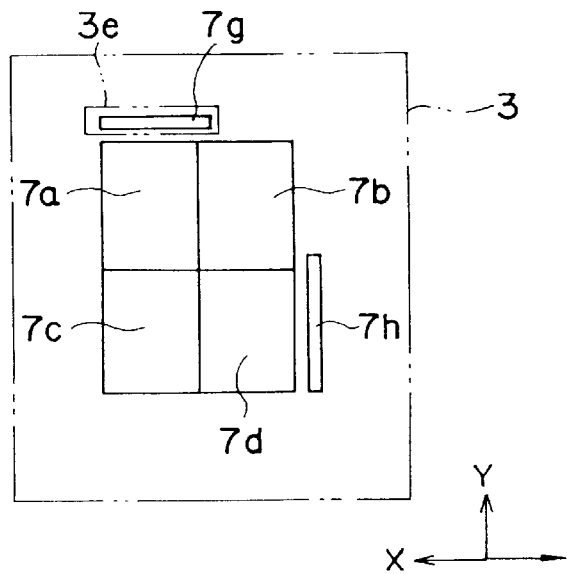
FIG. 9A is a plan view illustrating the fourth example of the positional relationship between the reticle and the blind shown in FIG. 4.

Subsequently, by moving the shielding plates 3a to 3d of the blind 3 to the position illustrated in FIG. 9A, the opening part 3e of the blind 3 is formed in a position, size, and shape such that the light is projected only through the first slit pattern 7g on the reticule 7. The positional correspondence between the opening part 3e and the rejectable circuit pattern 12 is attained by moving the wafer stage 2.

Figure 9B:
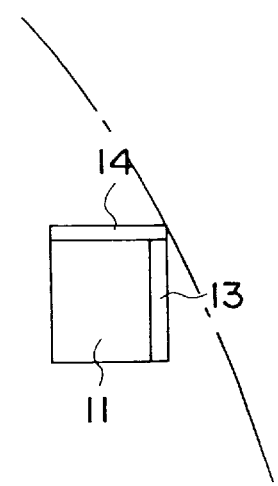
FIG. 9B is a plan view schematically illustrating the latent pattern image resulting from exposure using a reticle shielded from light by a blind as shown in FIG. 9A.

Then, the light which passes through the first slit pattern 7g is projected onto the part adjoining the available circuit pattern in the Y direction, to which the edge of the blind 3 is transferred. Consequently, a latent pattern image as illustrated in FIG. 9B is formed by completely erasing the blind edge which exists on the Y direction side of the available circuit pattern 11. As a result, the edge of the available circuit pattern 11 on the Y direction side is sharpened and, at the same time, the transferred part of the edge of the blind 3 in the Y direction is erased and a latent image 14 of a fine light exposure pattern is formed.

Since the first and second slit patterns 7g and 7h, are both given a slightly greater length than the parallel sides of the circuit patterns 7a to 7d on the reticule 7, the edge parts of the first and the second slit pattern 7g and 7h inevitably overlap each other when these slit patterns 7g and 7h are projected onto the resist R.

The exposure treatment described above is based on the fact that an abnormal pattern due to a blur of the focal point occurs in the part to which the edge of the blind 3 is projected when some of the plurality of circuit patterns 7a to 7d on the reticule 7 are covered by the blind 3. This fact is not disclosed in JP-A-07-142,309.

The latent circuit pattern images as are shown defined by solid lines and broken lines in FIG. 5A, are formed after completion of the step of repeatedly exposing the circuit pattern onto the resist using the reticule and the step of erasing the transferred part of the blind edge by the exposure to light. Consequently, circuit patterns which would overlap with the edge of the semiconductor wafer W are not exposed to light. Therefore, when the resist R is subjected to puddle development after the exposure described above, the resist R remains attached in the area lying along the edge of the semiconductor wafer W and, at the same time, the edges of the available circuit patterns formed near the edge thereof appear in a sharp unblurred shape.

Figure 5B:
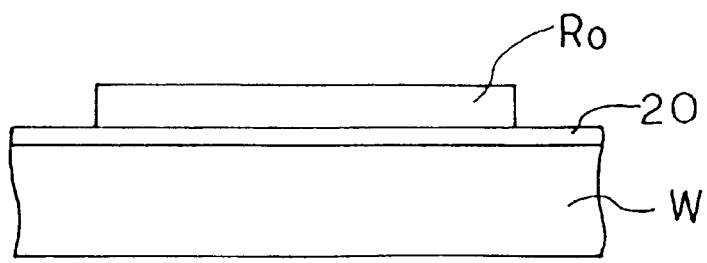
FIG. 5B is a cross section view of the semiconductor wafer.

After the development process such as is described above, is completed, a plurality of semiconductor integrated circuits are formed by a step of patterning a film 20 beneath a pattern Ro of the resist R, and by other steps which follow as shown in FIG. 5B.

Next, other examples of the reticule will be described below.

The number of circuit patterns to be formed in the reticle is not limited to four as illustrated in FIG. 4. The double exposure (peripheral exposure) by the slit pattern described above can be utilized wherever the number of circuit patterns is two or more, as illustrated in FIG. 10A to FIG. 14.

Figure 10A:
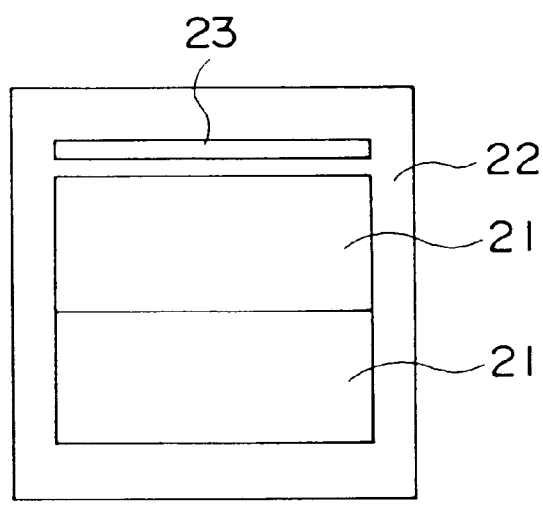
FIG. 10A and FIG. 10B are plan views respectively illustrating the second example and the third example of the reticule to be used in an embodiment of this invention.
Figure 10B:
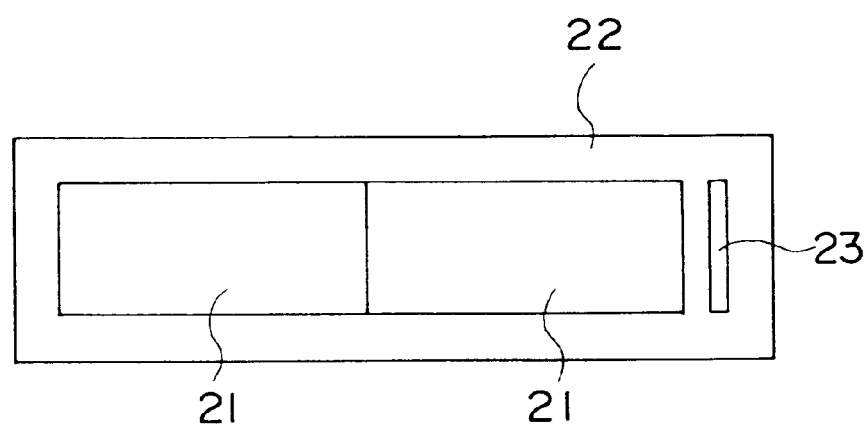

First, when the reticle to be used has a plurality of circuit pattern areas 21 arrayed in series in just one direction, as illustrated in FIG. 10A and FIG. 10B, it suffices to provide within the shielding of frame 22, at least one slit pattern 23 parallel to the boundary of the adjoining circuit pattern areas 21. This is because the edge of the blind 3 is projected near the boundary of the adjoining circuit pattern areas 21.

Figure 11:
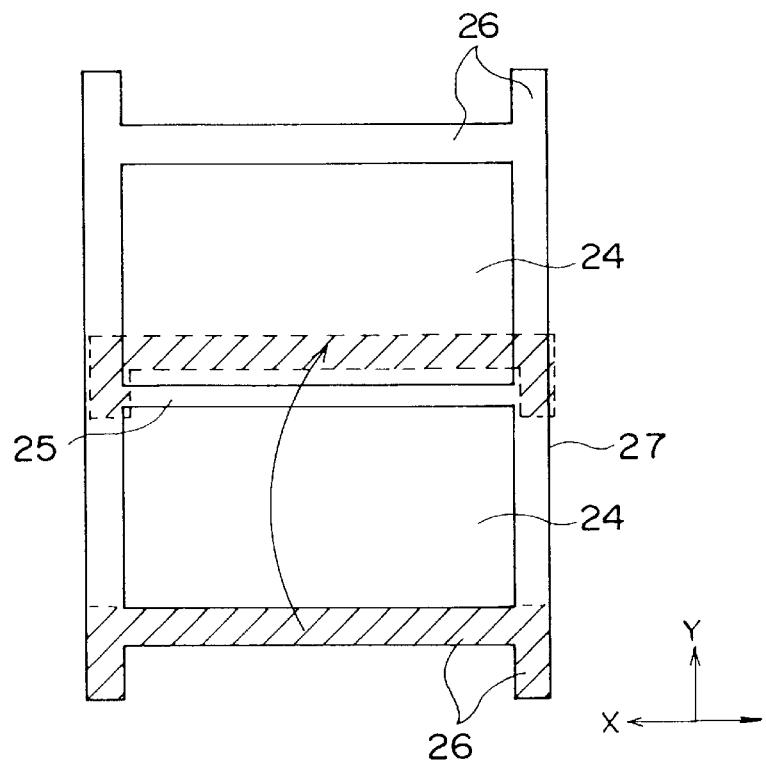
FIG. 11 is a plan view illustrating the fourth example of the reticule to be used in an embodiment of this invention.

When the reticle to be adopted is so constructed as to partition two circuit pattern areas 24 with a partition band 25 as illustrated in FIG. 11, a U-shaped auxiliary exposure pattern 26 may be provided instead of the slit pattern. In this case, all the edges of the four sides of the available circuit pattern area 24 are sharpened because the partition band 25 and the shielding frame 27 are transferred with a just focus.

The rejectable circuit pattern which is partially exposed, therefore, has the blind edge thereof enclosed within the transferred part of the partition band 25 and the U-shaped auxiliary pattern 26, as indicated by a broken line in FIG. 11. Light is therefore projected onto this enclosed area.

Incidentally, when a plurality of circuit patterns are positioned repeatedly in just one direction on the reticle, the light passing parts of the slit patterns and the U-shaped auxiliary patterns read only be of the same length as the bordering sides of the circuit patterns. The blind edge can be erased by projecting the light through these light passing parts.

Figure 12:
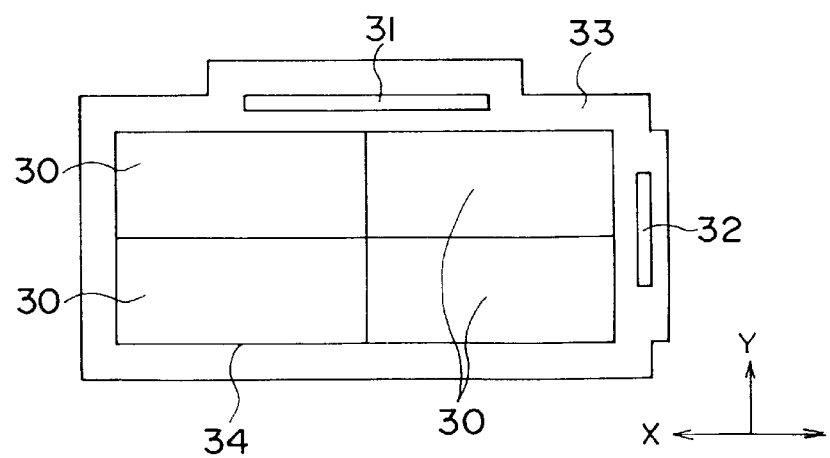
FIG. 12 is a plan view illustrating the fifth example of the reticule to be used in an embodiment of this invention.
Figure 13:
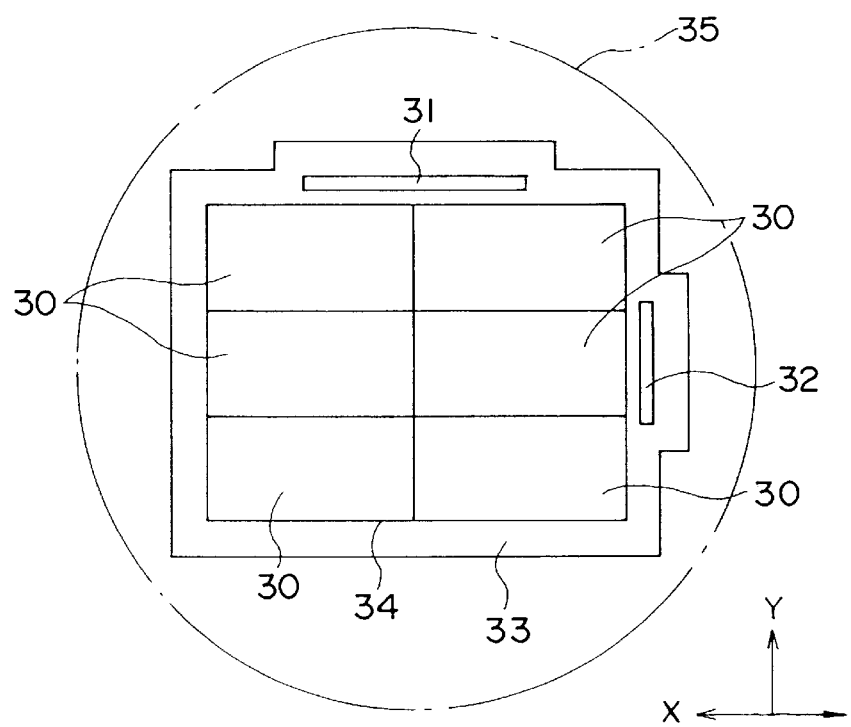
FIG. 13 is a plan view illustrating the sixth example of the reticule to be used in an embodiment of this invention.
Figure 14:
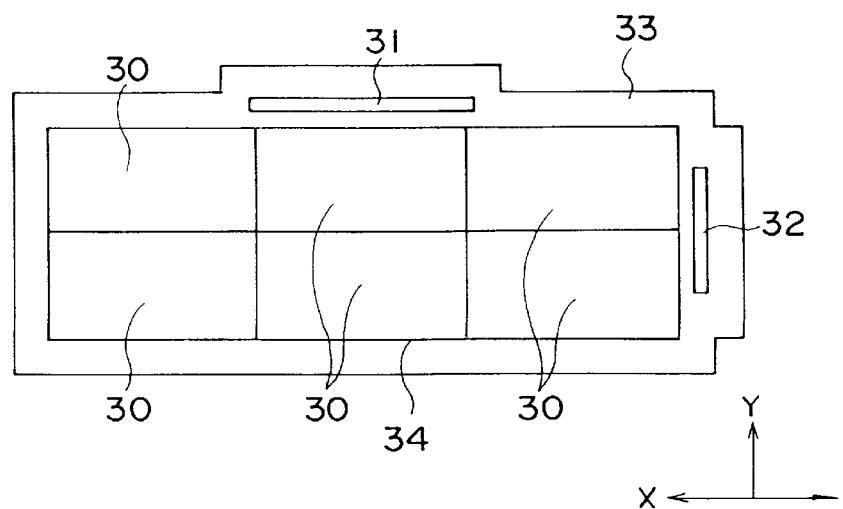
FIG. 14 is a plan view illustrating the seventh example of the reticule to be used in an embodiment of this invention.

When the reticle to be adopted has a plurality of circuit patterns 30 formed in both the X and the Y direction as shown in FIG. 12 to FIG. 14, it becomes necessary to form within the shielding frame 33, at least two slit patterns, 31 and 32, which are respectively parallel to the X direction and the Y direction. These slit patterns 31 and 32 are preferably positioned close to the center of the assembly area 34 for assembling the circuit patterns 30. This is because, the available exposure area on the stepper 2, the exposure device shown in FIG. 2, has a circular shape, for example, of about 22 mm in diameter. By positioning the slit patterns 31 and 32 to the center and with a narrow gap as shown in FIG. 13, therefore, the circuit patterns 30 can be position with the largest possible size in the available exposure area 35.

The preferred embodiment, as depicted above, has the slits and U-shaped auxiliary patterns for projecting the light onto the part of the resist to which the blind edge is transferred on the same reticle as the circuit patterns. However, they may be formed on different reticles. Also, in the method described above, the erasure of the blind edge was done after the exposure of the circuit pattern, but the order of these operations may be reversed.

Furthermore, it is preferable that both the slit patterns and the circuit patterns are only projected in positions where they do not protrude from the semiconductor wafer.

It is possible that a length of the light passing pattern has a length equal to the sum of the length of one side of each of the circuit patterns.

In this invention, as described above, after a plurality of circuit patterns in a reticle are projected onto a resist on a semiconductor wafer, with the exposure of the circuit patterns which overlap with the edge of the wafer being blocked by a blind, a separate mask is used to selectively expose the parts on the wafer to which the edge of the blind was projected, and to remove these parts.

As a result, the exposure of the ineffective circuit patterns which overlap with the edge of the wafer is prevented, the formation of abnormal resist patterns which occurs around the circumference of a semiconductor wafer is avoided, and the occurrence of abnormal resist patterns which occur as a result of the blurred focus where the edge of the blinds are projected is also prevented. It is therefore possible to greatly suppress the occurrence of particles, which arise from these abnormal resist patterns.

Further, since only those of the plurality of circuit patterns formed in the reticle which do not overlap with the edge of the semiconductor wafer are exposed to light, the number of available circuit patterns that are formed on the semiconductor wafer does not need to be reduced, making it possible to increase the yield.

There is no reduction in throughput because the reticle to be used has a plurality of circuit patterns formed therein.

The necessity for changing reticles is obviated and the decline of the throughput due to re-positioning is avoided because the circuit patterns and the patterns to be used for the erasure of the blind edge are formed on one and the same reticle.

What is claimed is:

1. A method for producing semiconductor devices comprising the steps of:

placing a first exposure mask in opposition to a resist film on a semiconductor wafer wherein a plurality of circuit patterns are formed repeatedly on a substrate of said exposure mask;

shielding one or more of said circuit patterns with a blind mask, where said one or more said circuit patterns overlap an edge of said semiconductor wafer while remaining circuit patterns do not overlap said edge;

exposing said resist film through said remaining circuit patterns of said first exposure mask which are not shielded with said blind mask to form exposed remaining circuit patterns and partially exposed resist film portions outside an edge of said exposed remaining circuit patterns.

exposing the partially exposed resist film portions by irradiating a light through at least one of a plurality of light passing patterns on a second exposure mask; and developing said resist film.

2. A method for producing semiconductor devices according to claim 1, wherein said first exposure mask and said second exposure mask are formed together on a substrate.

3. A method for producing semiconductor devices according to claim 2, wherein said circuit patterns of said first exposure mask are arranged in one direction.

4. A method for producing semiconductor devices according to claim 3, wherein said second exposure mask is adjacent to said first exposure mask in said one direction on said substrate.

5. A method for producing semiconductor devices according to claim 4, wherein at least one of said light passing patterns of said second exposure mask is positioned parallel to said circuit patterns of said first exposure mask.

6. A method for producing semiconductor devices according to claim 2, wherein said circuit patterns of first exposure mask are positioned adjacently in first and second directions perpendicular to each other, in a first area, and said light passing patterns of said second exposure mask are formed alongside said first areas in said first or second directions.

7. A method for producing semiconductor devices according to claim 6, wherein said light passing pattern of said second exposure mask is selected from among a plurality of light passing patterns formed around said first area.

8. A method for producing semiconductor devices according to claim 6, wherein said first area is a polygon shape, with said polygon shape having a first side extending to said first direction, and said first light passing pattern is formed along said first side.

9. A method for producing semiconductor devices according to claim 8, wherein said light passing pattern is formed in the center of said first side.

10. A method for producing semiconductor devices according to claim 6, wherein said first area is a polygon shape, with said polygon shape having first and second sides along said first and second directions respectively, and said plurality of light passing patterns is formed in the center of said first or second side.

11. A method for producing semiconductor devices according to claim 1, wherein at least one of said light passing pattern of said second exposure mask has a length parallel to a first direction, and said length is longer than one side of each of the said circuit patterns parallel to said first direction.

12. A method for producing of semiconductor devices according to claim 1, wherein at least one of said light passing pattern of said second exposure mask has a length equal to one of the lengths of one side of each of said circuit patterns.

13. A method for producing of semiconductor devices according to claim 1, where each of said circuit patterns form a part of a dynamic random access memory cell.

* * * * *

UNITED STATES PATENT AND TRADEMARK OFFICE
CERTIFICATE OF CORRECTION

| | |
|---|---|
| PATENT NO. : 6,232,051 B1 | Page 1 of 1 |
| DATED : May 15, 2001 | |
| INVENTOR(S) : Kazuaki Suzuki | |

It is certified that error appears in the above-identified patent and that said Letters Patent is hereby corrected as shown below:

<u>Title page,</u>
Insert item -- [73] Assignee: Fujitsu Limited, Kawasaki (JP) --

Signed and Sealed this

Seventh Day of May, 2002

*Attest:*

*Attesting Officer*

JAMES E. ROGAN
*Director of the United States Patent and Trademark Office*